United States Patent
Shimamoto et al.

(10) Patent No.: US 11,467,190 B2
(45) Date of Patent: Oct. 11, 2022

(54) IN-VEHICLE VOLTAGE DETECTION CIRCUIT

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Kazushi Shimamoto, Yokkaichi (JP); Yuuki Sugisawa, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 17/044,522

(22) PCT Filed: Apr. 5, 2019

(86) PCT No.: PCT/JP2019/015149
§ 371 (c)(1),
(2) Date: Oct. 1, 2020

(87) PCT Pub. No.: WO2019/208172
PCT Pub. Date: Oct. 31, 2019

(65) Prior Publication Data
US 2021/0109133 A1    Apr. 15, 2021

(30) Foreign Application Priority Data
Apr. 26, 2018   (JP) .............................. JP2018-085095

(51) Int. Cl.
*G01R 19/00* (2006.01)
*G01R 31/3835* (2019.01)
(Continued)

(52) U.S. Cl.
CPC ........ *G01R 19/0038* (2013.01); *B60L 3/0046* (2013.01); *G01R 31/3835* (2019.01); *H01M 10/482* (2013.01); *H03K 17/687* (2013.01)

(58) Field of Classification Search
CPC ............ G01R 19/0038; G01R 31/3835; G01R 19/16542; G01R 31/396; B60L 3/0046;
(Continued)

(56) References Cited

U.S. PATENT DOCUMENTS

2010/0289497 A1    11/2010   Lum-Shue-Chan et al.
2011/0037432 A1*    2/2011   Sakurai ............... H01M 10/482
                                                            320/118
(Continued)

FOREIGN PATENT DOCUMENTS

| JP | H4-274777 A | 9/1992 |
| JP | 2007-85847 A | 4/2007 |
| JP | 2008-42970 A | 2/2008 |

OTHER PUBLICATIONS

International Search Report, Application No. PCT/JP2019/015149, dated Jun. 18, 2019. ISA/Japan Patent Office.

*Primary Examiner* — Feba Pothen
(74) *Attorney, Agent, or Firm* — Honigman LLP

(57) ABSTRACT

In a voltage detection circuit, if a driving signal is provided from a control circuit to a drive target circuit that is one of a plurality of individual detection circuits, and a non-driving signal is provided from the control circuit to the other non-target circuits, switch portions of the non-target circuits are turned off to prevent a current from flowing through first transistors and second transistors of the non-target circuits, whereby generation of the output voltages in the non-target circuits is stopped, and a switch portion of the drive target circuit is turned on so as to allow a current to flow through a first transistor and a second transistor of the drive target circuit, whereby a voltage according to a voltage across both (Continued)

ends of an electricity storage cell corresponding to the drive target circuit is applied to an output conductive path.

12 Claims, 4 Drawing Sheets

(51) Int. Cl.
    *B60L 3/00*           (2019.01)
    *H03K 17/687*      (2006.01)
    *H01M 10/48*       (2006.01)

(58) Field of Classification Search
    CPC .......................... B60L 2240/547; B60L 58/21; H01M 10/482; H01M 2220/20; H01M 10/425; H03K 17/687; Y02E 60/10
    See application file for complete search history.

(56) References Cited

U.S. PATENT DOCUMENTS

| | | | |
|---|---|---|---|
| 2014/0210612 A1* | 7/2014 | Shibata | G01R 19/16542 340/521 |
| 2014/0234678 A1 | 8/2014 | Butzmann | |
| 2018/0024198 A1* | 1/2018 | Izawa | G01R 31/396 320/132 |

* cited by examiner

IN-VEHICLE VOLTAGE DETECTION CIRCUIT

CROSS-REFERENCE TO RELATED APPLICATIONS

This application is the U.S. national stage of PCT/JP2019/015149 filed on Apr. 5, 2019, which claims priority of Japanese Patent Application No. JP 2018-085095 filed on Apr. 26, 2018, the contents of which are incorporated herein.

TECHNICAL FIELD

The present disclosure relates to an in-vehicle voltage detection circuit.

BACKGROUND

In general, batteries and capacitors mounted in vehicles are configured to ensure the overall required voltage of an electricity storage unit by a plurality of electricity storage cells being connected in series. Additionally, a circuit that detects the cell voltages of the electricity storage cells is incorporated in association with an electricity storage unit of this type, and is used for the purpose of, for example, preventing overcharge or overdischarge of the electricity storage cells.

Meanwhile, when the cell voltages of a plurality of electricity storage cells constituting an electricity storage unit are detected using a control device such as a microcomputer, there is the problem that a very large number of input ports are required if an input port is to be provided for each electricity storage cell.

Regarding this problem, in the voltage measurement device disclosed in JP 2008-42970A, balance correction is constantly performed by a voltage balance correction circuit such that all cells (B1 to B2n) have the same voltage, and then only cell voltages appearing in some specific cells are detected. However, with the method as described in JP 2008-42970A, it is essential to constantly perform balance correction. Moreover, in a state in which the cell voltages of the cells vary, there is a problem in that it is not possible to individually detect the cell voltages.

The present disclosure has been made in view of the above-described situation, and it is an object of the disclosure to achieve, with a simpler configuration, a voltage detection circuit capable of individually detecting cell voltages of an in-vehicle electricity storage portion including a plurality of electricity storage cells connected in series.

SUMMARY

An in-vehicle voltage detection circuit according to an aspect of the present disclosure is an in-vehicle voltage detection circuit for detecting a voltage of an in-vehicle electricity storage portion including a plurality of electricity storage cells connected in series. The in-vehicle voltage detection circuit includes a plurality of individual detection circuits that are provided in one-to-one correspondence with at least two or more of the plurality of electricity storage cells, and that are each configured to generate an output voltage according to a voltage across both ends of the corresponding one of the electricity storage cells if a driving signal is provided, and to stop generation of the output voltage if a non-driving signal is provided. A common output conductive path serves as a path to which the output voltage generated in each of the individual detection circuits is applied. A control circuit is configured to output a driving signal and a non-driving signal to each of the plurality of individual detection circuits. Each of the individual detection circuits includes: an NPN-type first transistor having a base electrically connected to a low potential-side electrode of the electricity storage cell corresponding to the individual detection circuit, and a collector electrically connected to a high potential-side electrode of the corresponding electricity storage cell; a PNP-type second transistor having a base electrically connected to an emitter of the first transistor; a first resistive portion disposed between a connection portion connecting the emitter of the first transistor and the base of the second transistor to each other and a ground portion; a switch portion that is provided in series with the first resistive portion between the connection portion and the ground portion, and that is configured to be turned on so as to provide a conducting state between the connection portion and the ground portion if a driving signal is provided to the individual detection circuit, and to be turned off so as to provide a non-conducting state between the connection portion and the ground portion if a non-driving signal is provided; and a second resistive portion having one end electrically connected to a high potential-side electrode of the electricity storage cell corresponding to the individual detection circuit, and another end electrically connected to an emitter of the second transistor. A collector of each of the second transistors in the plurality of individual detection circuits is electrically connected to the output conductive path, and if a driving signal is provided from the control circuit to a drive target circuit that is one of the plurality of individual detection circuits, and a non-driving signal is provided from the control circuit to the other non-target circuits, the switch portions of the non-target circuits are configured to be turned off so as to prevent a current from flowing through the first transistors and the second transistors of the non-target circuits, whereby generation of the output voltages in the non-target circuits is stopped, and the switch portion of the drive target circuit is configured to be turned on so as to allow a current to flow through the first transistor and the second transistor of the drive target circuit, whereby a voltage according to a voltage across both ends of the electricity storage cell corresponding to the drive target circuit is applied to the output conductive path.

Advantageous Eeffects of Disclosure

In the in-vehicle voltage detection circuit, if the control circuit provides a driving signal to any drive target circuit, a voltage according to the voltage across both ends of the electricity storage cell corresponding to the drive target circuit is applied to the output conductive path, and generation of the output voltage is stopped in the remaining individual detection circuits (non-target circuits) to which a non-driving signal is provided from the control circuit. Due to such a configuration, it is possible to detect the cell voltages of the plurality of electricity storage cells by the control circuit switching the driving signal. Moreover, the detection of the cell voltages can be performed via the common output conductive path, and it is therefore not necessary to provide the number of outputting signal lines corresponding to the number of cells to be detected.

Furthermore, each of the individual detection circuits can be implemented in a form including the first transistor, the second transistor, the resistive portion, the resistive portion, and the switch portion as main elements, and with a configuration that is simpler and can be easily made compact. Accordingly, this advantage can be utilized for the number of individual detection circuits, and hence, the characteristic voltage detection circuit "that detects cell voltages via a common output conductive path" can be achieved in a simpler and more compact manner.

DETAILED DESCRIPTION OF PREFERRED EMBODIMENTS

Figure 1:
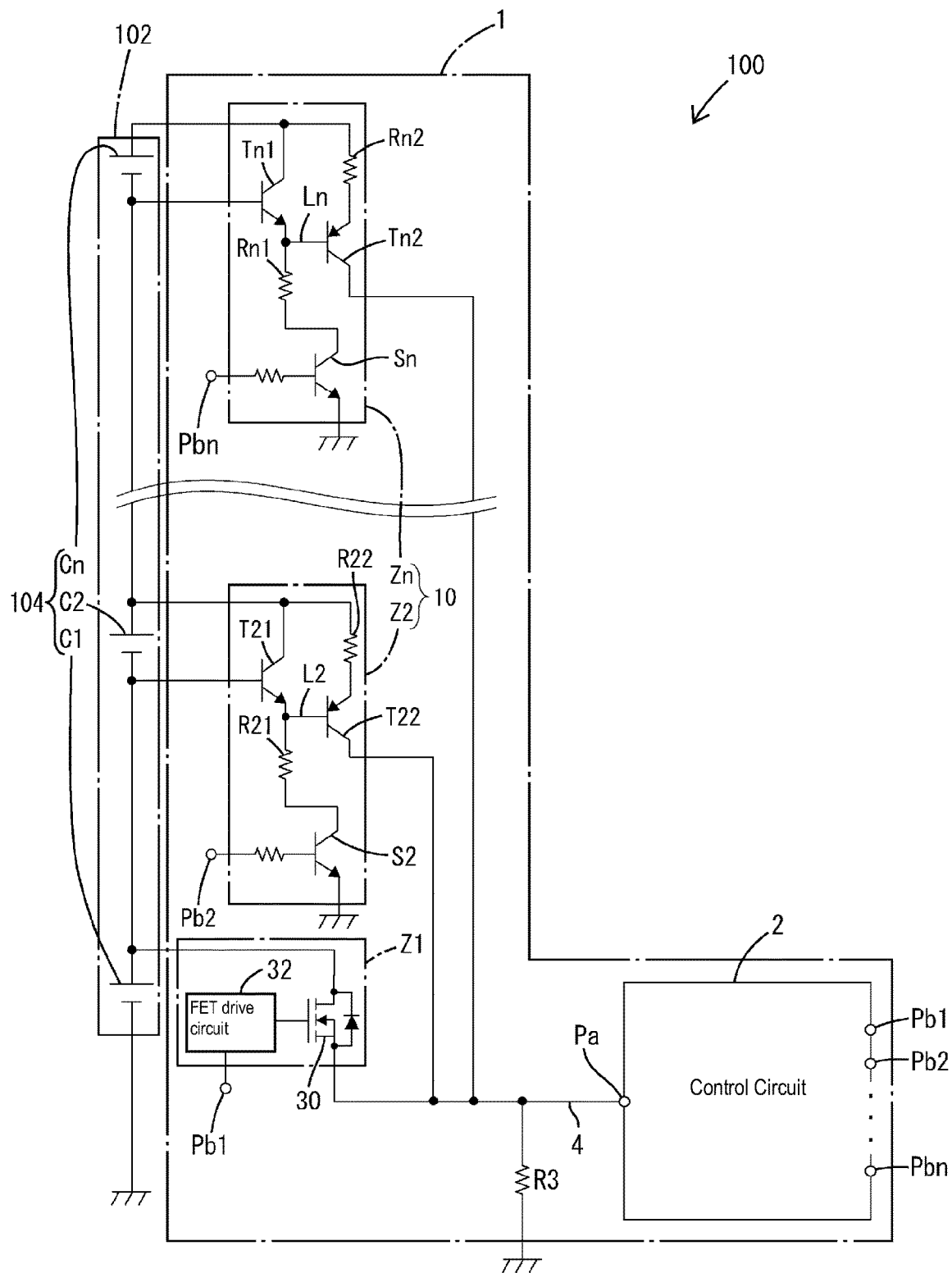
FIG. 1 is a circuit diagram schematically illustrating an in-vehicle power supply system including an in-vehicle voltage detection circuit according to Embodiment 1 of the present disclosure.
Figure 2:
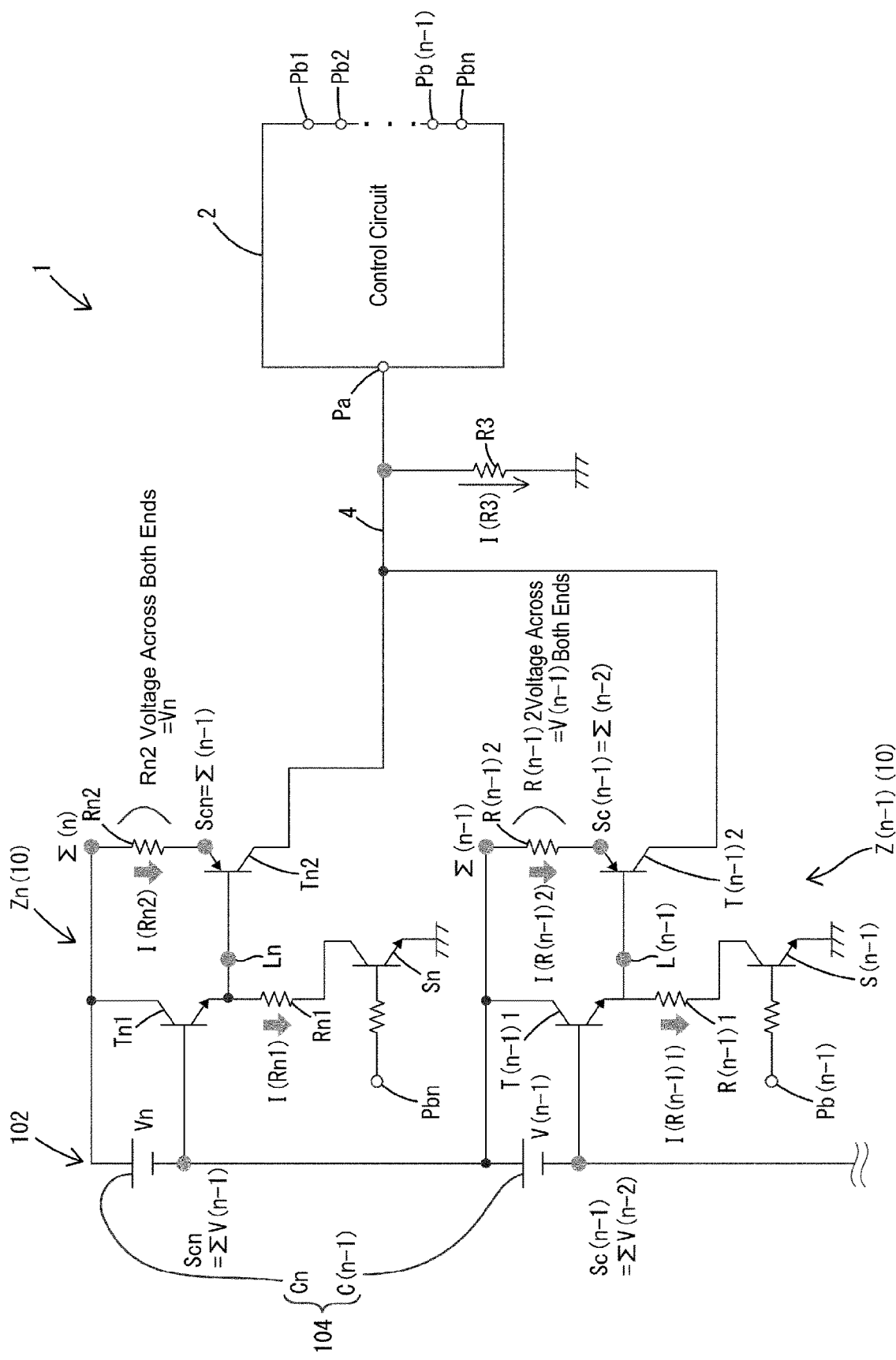
FIG. 2 is an explanatory diagram illustrating, in enlargement, a part of the voltage detection circuit of Embodiment 1.

Here, preferred examples of the present disclosure will be described.

An in-vehicle voltage detection circuit according to an aspect of the present disclosure may include a third resistive portion having one end electrically connected to an output conductive path, and the other end electrically connected to a ground portion. Also, the voltage detection circuit may be configured such that, if a driving signal is provided from the control circuit to the drive target circuit, a current according to the current flowing through the second transistor of the drive target circuit flows through the third resistive portion, and a voltage according to the voltage across both ends of the third resistive portion is applied to the output conductive path.

The voltage detection circuit configured in this manner may have, in addition to a configuration in which the detection of the cell voltages can be performed via the common output conductive path, a configuration in which a detection value according to each of the cell voltages can be determined from the ratio between the second resistive portion and the third resistive portion.

In the voltage detection circuit provided with the third resistive portion, the resistance value of the first resistive portion may be set such that, in each of the individual detection circuits, the voltage across the base and the emitter of the first transistor and the voltage across the base and the emitter of the second transistor are identical.

With the voltage detection circuit configured in this manner, the potential of one end of the second resistive portion and the potential of the low potential-side electrode of the corresponding electricity storage cell can be identical or approximate to each other in each of the individual detection circuits. Accordingly, the voltage across both ends of the second resistive portion more accurately reflects the voltage across both ends of the corresponding electricity storage cell. Therefore, it is possible to achieve a configuration in which a voltage that allows for the cell voltage of each of the electricity storage cells to be specified more accurately can be output to the common output conductive path.

In the voltage detection circuit provided with the third resistive portion, each of the resistance values of the plurality of second resistive portions in the plurality of individual detection circuits and the resistance value of the third resistive portion may be identical.

With the voltage detection circuit configured in this manner, in each of the individual detection circuits, the voltage across both ends of the second resistive portion and the voltage across both ends of the third resistive portion can be substantially identical or approximate to each other when the individual detection circuit is selected as the drive target circuit, so that a value substantially identical to the cell voltage of the corresponding electricity storage cell, or a value closer to that cell voltage can be output to the common output conductive path.

In the voltage detection circuit provided with the third resistive portion, a low potential-side cell disposed on the lowest potential side among the plurality of electricity storage cells constituting the in-vehicle electricity storage portion may have a low potential-side electrode electrically connected to a ground portion. Furthermore, the voltage detection circuit may include a low potential-side detection circuit including a semiconductor switch element having one end electrically connected to a high potential-side electrode of the low potential-side cell, and another end electrically connected to the output conductive path. Also, the low potential-side detection circuit may be configured to turn on the semiconductor switch element so as to electrically connect the high potential-side electrode of the low potential-side cell and the output conductive path to each other if a driving signal is provided from the control circuit to the low potential-side detection circuit, and to turn off the semiconductor switch element so as to interrupt electrical connection between the high potential-side electrode of the low potential-side cell and the output conductive path if a non-driving signal is provided. Also, in the voltage detection circuit, each of the resistance values of the plurality of second resistive portion in the plurality of individual detection circuits may be larger than the resistance value of the third resistive portion.

In the voltage detection circuit configured in this manner, if a driving signal is provided from the control circuit, and a non-driving signal is provided to the other individual detection circuits, a voltage reflecting the voltage across both ends of the low potential-side cell is output to the common output conductive path. In this case, the voltage that is output to the common output conductive path is a voltage according to a value obtained by subtracting the amount of the voltage dropped in the semiconductor switch element from the voltage of the high potential-side electrode of the low potential-side cell. Accordingly, if no measures are taken, there is the possibility that a value lower than the actual cell voltage may be output to the common output conductive path only when the cell voltage of the low potential-side cell is detected, which may make it necessary to use different detection methods for the detection of the cell voltage of the low potential-side cell and the detection of the cell voltages of the other electricity storage cells. However, if each of the resistance values of the second resistive portions is set to be larger than the resistance value of the third resistive portion as described above, it is possible to make adjustments such that a value lower than the actual cell voltage is output to the common output conductive path also when the cell voltages of the other electricity storage cells are detected.

In the in-vehicle voltage detection circuit according to an aspect of the present disclosure, a low potential-side cell disposed on the lowest potential side among the plurality of electricity storage cells constituting the in-vehicle electricity storage portion may have a low potential-side electrode electrically connected to a ground portion. Also, the in-vehicle voltage detection circuit may include a low potential-side detection circuit including a field effect transistor (FET) having one end electrically connected to a high potential-side electrode of the low potential-side cell, and another end electrically connected to the output conductive path. Furthermore, the low potential-side detection circuit may be configured to turn on the FET so as to electrically connect the high potential-side electrode of the low potential-side cell and the output conductive path to each other if a driving signal is provided from the control circuit to the low potential-side detection circuit, and to turn off the FET so as to interrupt electrical connection between the high potential-side electrode of the low potential-side cell and the output conductive path if a non-driving signal is provided.

In the voltage detection circuit configured in this manner, if a driving signal is provided from the control circuit to the low potential-side detection circuit, and a non-driving signal is provided to the other individual detection circuits, a voltage reflecting the voltage across both ends of the low potential-side cell is output to the common output conductive path. In this case, the voltage that is output to the common output conductive path is a voltage according to a value obtained by subtracting the amount of the voltage dropped in the FET from the voltage of the high potential-side electrode of the low potential-side cell. However, using the FET along this path can reduce the voltage drop, and therefore a voltage more accurately reflecting the voltage of the high potential-side electrode of the low potential-side cell can be output to the common output conductive path.

Embodiment 1

Hereinafter, Embodiment 1 in which the present disclosure is further embodied will be described.

An in-vehicle battery system 100 shown in FIG. 1 includes an in-vehicle electricity storage portion 102 (hereinafter also referred to as "electricity storage portion 102) including a plurality of electricity storage cells 104 connected in series, and an in-vehicle voltage detection circuit 1 (hereinafter also referred to as "voltage detection circuit 1") capable of detecting a voltage across both ends (cell voltage) of each of the electricity storage cells 104 of the electricity storage portion 102, and outputting a detection value that allows for the value of each of the cell voltages to be specified.

The in-vehicle electricity storage portion 102 is an electricity storage means that is capable of functioning as an in-vehicle power supply, and may be, for example, an in-vehicle battery mounted in a vehicle as a power supply or the like of a traveling motor of an electric vehicle (EV or HEV), or may be an in-vehicle capacitor used as a backup power supply, another auxiliary power supply, or the like. The in-vehicle electricity storage portion 102 is configured, for example, as known electricity storage means such as a lithium ion secondary battery, a nickel hydrogen secondary battery, an electric double layer capacitor, and a lithium ion capacitor.

In the configuration shown in FIG. 1, a low potential-side cell C1 (hereinafter also referred to as "first cell C1") disposed on the lowest potential side among the plurality of electricity storage cells 104 constituting the in-vehicle electricity storage portion 102 includes a low potential-side electrode (negative electrode) electrically connected to a ground portion, and the negative electrode of the low potential-side cell C1 is maintained at a ground potential (e.g., 0 V). A high potential-side cell (n-th cell Cn) disposed on the highest potential-side among the plurality of electricity storage cells 104 constituting the in-vehicle electricity storage portion 102 has a high potential-side electrode (positive electrode) electrically connected to a power path, which is not shown, and power is output via the power path from the in-vehicle electricity storage portion 102.

The voltage detection circuit 1 is a circuit for detecting the voltage of the in-vehicle electricity storage portion 102, and mainly includes individual detection circuits 10, a low potential-side detection circuit Z1, an output conductive path 4, a third resistive portion R3, a control circuit 2, and so forth.

The control circuit 2 is configured as, for example, an information processing device such as a microcomputer, and includes an input terminal Pa, output terminals Pb1, Pb2 . . . Pbn, an arithmetic circuit such as a CPU (not shown), a storage unit such a ROM or a RAM (not shown), an AD converter (not shown), and so forth. The control circuit 2 is a circuit capable of outputting a driving signal (e.g., a high-level signal of a predetermined voltage) and a non-driving signal (e.g., a low-level signal of a predetermined voltage lower than that of the driving signal) to each of the plurality of individual detection circuits 10, and is also capable of outputting the driving signal and the non-driving signal to the low potential-side detection circuit Z1. The control circuit 2 is capable of performing drive control so as to alternatively output the driving signal to one of the output terminals Pb1, Pb2 . . . Pbn, and to output the non-driving signal to the remaining terminals. In addition, the control circuit 2 also has the function of detecting a voltage (i.e., the potential of the output conductive path 4) applied to the input terminal Pa during the above-described drive control.

The common output conductive path 4 is a path to which output voltages generated in each of the individual detection circuits 10 and the low potential-side detection circuit Z1 are applied, and has one end electrically connected to the input terminal Pa of the control circuit 2.

The third resistive portion R3 has one end electrically connected to the output conductive path 4, and the other end electrically connected to a ground portion. That is, the voltage of the output conductive path 4 is a voltage across both ends of the third resistive portion R3.

The plurality of individual detection circuits 10 have the same configuration except for constants such as resistance values. Note that FIG. 1 shows an example in which n electricity storage cells 104 are provided, and n−1 individual detection circuits 10 are provided. The value of n is preferably 3 or more.

The plurality of individual detection circuits 10 are provided in one-to-one correspondence with at least two or more (the remaining cells C2, . . . Cn excluding the low potential-side cell C1 in the example shown in FIG. 1) of the plurality of electricity storage cells 104, and each of the individual detection circuits 10 is configured to generate an output voltage according to the voltage across both ends of the corresponding electricity storage cell if a driving signal is provided, and to stop generation of the output voltage if a non-driving signal is provided. Although the illustration between the second cell C2 and the cell Cn is omitted in the example shown in FIG. 1, one or more electricity storage cells 104 may be further provided in series between the second cell C2 and the cell Cn. When one or more electricity storage cells 104 are further provided in series between the second cell C2 and the cell Cn in this manner, the individual detection circuits 10 may be provided in one-to-one correspondence with these electricity storage cells 104.

Each of the individual detection circuits 10 includes: a first transistor formed by an NPN-type bipolar transistor having a base electrically connected to a low potential-side electrode of the electricity storage cell corresponding to the individual detection circuit 10, and a collector electrically connected to a high potential-side electrode of the corresponding electricity storage cell; a second transistor formed by a PNP-type bipolar transistor having a base electrically connected to an emitter of the first transistor; a first resistive portion disposed between a connection portion connecting an emitter of the first transistor and the base of the second transistor to each other and a ground portion; and a switch portion that is provided in in series with the first resistive portion between the connection portion and the ground portion, and that is configured to be turned on so as to provide a conducting state between the connection portion and the ground portion if a driving signal is provided to the individual detection circuit 10, and to be turned off so as to provide a non-conducting state between the connection portion and the ground portion if a non-driving signal is provided.

For example, an individual detection circuit Z2 in the second stage, which is the individual detection circuit 10 corresponding to the electricity storage cell 104 (second cell C2) in the subsequent stage (second stage) of the low potential-side cell C1 includes a first transistor T21, a second transistor T22, a first resistive portion R21, a second resistive portion R22, and a switch portion S2.

The first transistor T21 has a base electrically connected to the low potential-side electrode (negative electrode) of the electricity storage cell 104 (second cell C2) corresponding to the individual detection circuit Z2 in the second stage, and a collector electrically connected to the high potential-side electrode (positive electrode) of the electricity storage cell 104 (second cell C2) and one end of the second resistive portion R22. The individual detection circuit Z2 is configured such that the base potential of the first transistor T21 is the negative electrode potential of the second cell C2, and the collector potential of the first transistor T21 is the positive electrode potential of the second cell C2 and the potential of the one end of the second resistive portion R22. The first transistor T21 has an emitter electrically connected to the base of the second transistor T22 and one end of the first resistive portion R21, and the emitter potential of the first transistor T21 is configured to be equal to the base potential of the second transistor T22 and the potential of the one end of the first resistive portion R21.

The first resistive portion R21 is disposed between a connection portion L2 connecting the emitter of the first transistor T21 and the base of the second transistor T22 to each other and the ground portion. In the example shown in FIG. 1, the other end of the first resistive portion R21 is electrically connected to one end (specifically, the collector) of the switch portion S2.

The second resistive portion R22 has one end electrically connected to the high potential-side electrode (positive electrode) of the electricity storage cell 104 (second cell C2) corresponding to the individual detection circuit Z2 in the second stage, and the other end electrically connected to the emitter of the second transistor T22. The potential of the one end of the second resistive portion R22 is the positive electrode potential of the second cell C2, and the potential of the other end of the second resistive portion R22 is the emitter potential of the second transistor T22.

The second transistor T22 has an emitter electrically connected to the other end of the second resistive portion R22, and a collector electrically connected to the output conductive path 4. The base potential of the second transistor T22 is equal to the emitter potential of the first transistor T21 and the potential of the one end of the first resistive portion R21, the emitter potential of the second transistor T22 is equal to the potential of the other end of the second resistive portion R22, and the collector potential of the second transistor T22 is equal to the potential of the output conductive path 4.

The switch portion S2 is configured as a semiconductor switch, and is formed by an NPN-type bipolar transistor in the example shown in FIG. 1. The switch portion S2 is provided in series with the first resistive portion R21 between the connection portion L2 described above and a ground portion, and has a collector electrically connected to the other end of the first resistive portion R21, an emitter electrically connected to the ground portion, and a base electrically connected to the output terminal Pb2 of the control circuit 2 via a resistive portion in the example shown in FIG. 1. The switch portion S2 functions to be turned on so as to provide a conducting state between the connection portion L2 and the ground portion if a driving signal is provided from the control circuit 2 to the individual detection circuit Z2 in the second stage (i.e., if a driving signal is output from the output terminal Pb2), and to be turned off so as to provide a non-conducting state between the connection portion L2 and the ground portion if a non-driving signal is provided.

The individual detection circuit Zn in the nth stage, which is the individual detection circuit 10 corresponding to the electricity storage cell 104 in the nth stage (n-th cell Cn) includes a first transistor Tn1, a second transistor Tn2, a first resistive portion Rn1, a second resistive portion Rn2, and a switch portion Sn.

The first transistor Tn1 has a base electrically connected to the low potential-side electrode (negative electrode) of the electricity storage cell 104 (n-th cell Cn) corresponding to the individual detection circuit Zn in the nth stage, and a collector electrically connected to the high potential-side electrode (positive electrode) of the electricity storage cell 104 (n-th cell Cn) and one end of the second resistive portion Rn2. In the individual detection circuit Zn, the base potential of the first transistor Tn1 is the negative electrode potential of the n-th cell Cn, and the collector potential of the first transistor Tn1 is the positive electrode potential of the n-th cell Cn and the potential of the one end of the second resistive portion Rn2. The emitter of the first transistor Tn1 is electrically connected to the base of the second transistor Tn2 and the one end of the first resistive portion Rn1, and the emitter potential of the first transistor Tn1 is equal to the base potential of the second transistor Tn2 and the potential of the one end of the first resistive portion Rn1.

The first resistive portion Rn1 is disposed between the connection portion Ln connecting the emitter of the first transistor Tn1 and the base of the second transistor Tn2 to each other and a ground portion. In the example shown in FIG. 1, the other end of the first resistive portion Rn1 is electrically connected to one end (specifically, the collector) of the switch portion Sn.

The second resistive portion Rn2 has one end electrically connected to the high potential-side electrode (positive electrode) of the electricity storage cell 104 (n-th cell Cn) corresponding to the individual detection circuit Zn in the nth stage, and the other end electrically connected to the emitter of the second transistor Tn2.

The second transistor Tn2 has an emitter electrically connected to the other end of the second resistive portion Rn2, and a collector electrically connected to the output conductive path 4. The base potential of the second transistor Tn2 is equal to the emitter potential of the first transistor Tn1 and the potential of the one end of the first resistive portion Rn1, the emitter potential of the second transistor Tn2 is equal to the potential of the other end of the second resistive portion Rn2, and the collector potential of the second transistor Tn2 is equal to the potential of the output conductive path 4.

The switch portion Sn is configured as a semiconductor switch, and is formed by an NPN-type bipolar transistor in the example shown in FIG. 1. The switch portion Sn is provided in series with the first resistive portion Rn1 between the connection portion Ln described above and the ground portion, and has a collector electrically connected to the other end of the first resistive portion Rn1, an emitter electrically connected to the ground portion, and a base electrically connected to the output terminal Pbn of the control circuit 2 via a resistive portion in the example shown in FIG. 1. The switch portion Sn functions to be turned on so as to provide a conducting state between the connection portion Ln and the ground portion if a driving signal is provided from the control circuit 2 to the individual detection circuit Zn in the nth stage (i.e., if a driving signal is output from the output terminal Pbn), and to be turned off so as to provide a non-conducting state between the connection portion Ln and the ground portion if a non-driving signal is provided.

In the plurality of individual detection circuits 10 configured in this manner, the collector of each of the second transistors T22, . . . Tn2 is electrically connected to the output conductive path 4, and each of the collector potentials is configured to be equal to the potential of the output conductive path 4.

The low potential-side detection circuit Z1 includes a FET 30 and a FET drive circuit 32. The FET 30 has one end electrically connected to the high potential-side electrode (positive electrode) of the low potential-side cell C1, and the other end electrically connected to the output conductive path 4. The FET drive circuit 32 includes a signal line connected to a gate of the FET 30, and outputs an ON signal to the gate of the FET 30 so as to bring the FET 30 into an ON state if a driving signal is provided from the control circuit 2 via the output terminal Pb1. The FET drive circuit 32 outputs an OFF signal to the gate of the FET 30 so as to bring the FET 30 into an OFF state if a non-driving signal is provided from the control circuit 2 via the output terminal Pb1. Thus, the low potential-side detection circuit Z1 turns on the FET 30 so as to electrically connect the high potential-side electrode (positive electrode) of the low potential-side cell C1 and the output conductive path 4 to each other if a driving signal is provided from the control circuit 2 to the low potential-side detection circuit Z1, and turns off the FET 30 so as to interrupt electrical connection between the high potential-side electrode (positive electrode) of the low potential-side cell C1 and the output conductive path 4 if a non-driving signal is provided.

Next, the operation of the voltage detection circuit 1 will be described.

In the following description, voltages across both ends of cells are associated such that the voltage across both ends of the cell in the first stage (first cell C1) is denoted as V1, and the voltage across both ends of the cell in the second stage (second cell C2) is denoted as V2, counting from the ground portion side of the in-vehicle electricity storage portion 102. Also, the voltage across both ends of the cell in the n−1th stage ((n−1)th cell) is denoted as V(n−1), and the voltage across both ends of the cell in the nth stage (n-th cell) is denoted as Vn, counting from the ground portion side.

In the voltage detection circuit 1, the control circuit 2 alternatively outputs a driving signal to one of the output terminals Pb1, Pb2 . . . Pbn, and outputs a non-driving signal to the remaining output terminals when a voltage detecting operation is performed.

If a driving signal is provided to one of the plurality of individual detection circuits 10, that is, if a driving signal is provided to one of the output terminals Pb2 . . . Pbn, the individual detection circuit 10 to which the driving signal is provided operates as a drive target circuit, and the other individual detection circuits 10 operate as non-target circuits. In this case, the switch portion of the drive target circuit is turned on, and the switch portions of the non-target circuits are turned off. In each of the non-target circuits, when the switch portion is turned off, the first transistor and the second transistor are both maintained in the OFF state, therefore a current does not flow through the first transistor and the second transistor, so that generation of the output voltage is stopped in the non-target circuit. If a driving signal is not also provided to the low potential-side detection circuit Z1, the FET 30 is also in the OFF state, and therefore the low potential-side cell C1 and the output conductive path 4 are not electrically connected to each other.

On the other hand, for the drive target circuit, the switch portion is turned on so as to bring both the first transistor and the second transistor of the drive target circuit into an ON state, so that a current flows through the first transistor and the second transistor, and a voltage according to the voltage across both ends of the electricity storage cell 104 corresponding to the drive target circuit is applied to the output conductive path 4.

With the present configuration, in each of the individual detection circuits 10, the resistance value of the first resistive portion is set such that the voltage across the base and the emitter of the first transistor and the voltage across the base and the emitter of the second transistor are identical when the individual detection circuit 10 serves as the drive target circuit. Note that the voltage applied to the first resistive portion changes depending on the number of stages of individual detection circuits 10, and therefore the resistance value of the first resistive portion is separately adjusted in each of the individual detection circuits 10. For example, the resistance value of the first resistive portion R21 is set in advance such that the voltage across the base and the emitter of the first transistor T21 and the voltage across the base and the emitter of the second transistor T22 are identical if the first transistor T21 and the second transistor T22 are turned on, with the individual detection circuit Z2 in the second stage serving as the drive target circuit. Similarly, the resistance value of the first resistive portion Rn1 is set in advance such that the voltage across the base and the emitter of the first transistor Tn1 and the voltage across the base and the emitter of the second transistor Tn2 are identical if the first transistor Tn1 and the second transistor Tn2 are turned on, with the individual detection circuit Zn in the nth stage serving as the drive target circuit. Furthermore, the resistance value of each of the plurality of second resistive portions R22, . . . Rn2 in the plurality of individual detection circuits 10 and the resistance value of the third resistive portion R3 are identical.

For example, if a driving signal has been output from the control circuit 2 to the output terminal Pbn, the individual detection circuit Zn in the nth stage that is connected to the output terminal Pbn serves as the drive target circuit, and the switch portion Sn is turned on so as to bring both the first transistor Tn1 and the second transistor Tn2 of the individual detection circuit Zn into the ON state, so that a current flows therethrough. At this time, where Scn is the potential of the low potential-side electrode (negative electrode) of the electricity storage cell 104 (n-th cell Cn) corresponding to the individual detection circuit Zn, Vbe(Tn1) is the voltage across the base and the emitter (potential difference) of the first transistor Tn1, and Vbe(Tn2) is the voltage across the base and the emitter (potential difference) of the second transistor Tn2, the potential of the connection portion Ln is Scn−Vbe(Tn1), and the potentials of the emitter of the transistor Tn2 and the other end of the second resistive portion Rn2 are Scn−Vbe(Tn1)−Vbe(Tn2). Since the resistance value of the first resistive portion Rn1 is adjusted in advance such that Vbe(Tn1)=Vbe(Tn2) when the first transistor Tn1 and the second transistor Tn2 are turned on (i.e., the collector current value of the first transistor Tn1 is adjusted), the potentials of the emitter of the transistor Tn2 and the other end of the second resistive portion Rn2 are Scn. That is, the potentials of the emitter of the transistor Tn2 and the other end of the second resistive portion Rn2 are identical to the potential of the low potential-side electrode (negative electrode) of the electricity storage cell 104 (n-th cell) corresponding to the individual detection circuit Zn, and therefore the voltage across both ends of the second resistive portion Rn2 is identical to the voltage across both ends of the electricity storage cell 104 (n-th cell Cn) corresponding to the individual detection circuit Zn. Note that the negative electrode potential Scn of the n-th cell Cn is the sum of the cell voltages (voltages across both ends) of the electricity storage cells 104 in the first to n−1th stages (ΣV(n−1)=V1+V2+ . . . V(n−1)).

When the first transistor Tn1 and the second transistor Tn2 are turned on in response to a driving signal provided to the individual detection circuit Zn in this manner, a current according to the current flowing through the second transistor Tn2 of the individual detection circuit Zn flows through the third resistive portion R3, and a voltage according to the voltage across both ends of the third resistive portion R3 is applied to the output conductive path 4. For example, when only the individual detection circuit Zn among the plurality of individual detection circuits 10 and the low potential-side detection circuit Z1 is driven to turn on the first transistor Tn1 and the second transistor Tn2, where I(Rn2) is the current flowing through the second resistive portion Rn2 and I(R3) is the current flowing through the third resistive portion R3, the base current of the transistor Tn2 is sufficiently small, and therefore I(Rn2)≈I(R3) is satisfied. Since the resistance value of each of the plurality of second resistive portions R22, . . . Rn2 in the plurality of individual detection circuits 10 and the resistance value of the third resistive portion R3 are identical, if I(Rn2) and I(R3) are regarded to be identical, the voltage across both ends of the second resistive portion Rn2 and the voltage across both ends of the third resistive portion R3 are identical, and therefore the voltage of the output conductive path 4 is Vn, which is the voltage across both ends (cell voltage) of the electricity storage cell 104 (n-th cell Cn) corresponding to the individual detection circuit Zn. Thus, a voltage according to the voltage across both ends (cell voltage) Vn of the electricity storage cell 104 (n-th cell Cn) corresponding to the individual detection circuit Zn is applied to the output conductive path 4.

The same applies to the case where the individual detection circuit Z in the n−1th stage (n−1) corresponding to the electricity storage cell 104 in the n−1th stage (cell C(n−1)) serves as the drive target circuit. In this case, the switch portion S(n−1) is turned on so as to bring both the first transistor T(n−1)1 and the second transistor T(n−1)2 of the individual detection circuit Z(n−1) into an ON state, so that a current flows therethrough. At this time, where Sc(n−1) is the potential of the low potential-side electrode (negative electrode) of the electricity storage cell 104 (cell C(n−1)) corresponding to the individual detection circuit Z(n−1), Vbe(T(n−1)1) is the voltage across the base and the emitter (potential difference) of the first transistor T(n−1)1, and Vbe(T(n−1)2) is the voltage across the base and the emitter (potential difference) of the second transistor T(n−1)2, the potential of the connection portion L(n−1) is Sc(n−1)−Vbe(T(n−1)1), and the potentials of the emitter of the transistor T(n−1)2 and the other end of the second resistive portion R(n−1)2 are Sc(n−1)−Vbe(T(n−1)1)−Vbe(T(n−1)2). Since the resistance value of the first resistive portion R(n−1)1 is adjusted in advance such that Vbe(T(n−1)1)=Vbe(T(n−1)2) is satisfied when the first transistor T(n−1)1 and the second transistor T(n−1)2 are turned on, the potentials of the emitter of the transistor T(n−1)2 and the other end of the second resistive portion R(n−1)2 are Sc(n−1). That is, the potential of the other end of the second resistive portion R(n−1)2 is identical to the negative electrode potential of the electricity storage cell 104 (cell C(n−1)) corresponding to the individual detection circuit Z(n−1), and therefore is identical to the voltage across both ends of the cell C(n−1). Note that the negative electrode potential Sc(n−1) of the cell C(n−1) is the sum of the cell voltages (voltages across both ends) of the electricity storage cells 104 in the first to n−2th stages (ΣV(n−2)).

When only the individual detection circuit Z(n−1) is driven to turn on the first transistor T(n−1)1 and the second transistor T(n−1)2, where I(R(n−1)2) is the current flowing through the second resistive portion R(n−1)2 and I(R3) is the current flowing through the third resistive portion R3, the base current of the transistor T(n−1)2 is sufficiently small, and therefore I(R(n−1)2)≈I(R3) is satisfied. If I(R(n−1)2) and I(R3) are regarded to be identical, the voltage across both ends of the second resistive portion R(n−1)2 and the voltage across both ends of the third resistive portion R3 are identical, and the voltage of the output conductive path 4 is V(n−1), which is the voltage across both ends (cell voltage) of the electricity storage cell 104 (cell C(n−1)) corresponding to the individual detection circuit Z(n−1). Thus, a voltage according to the voltage across both ends V(n−1) of the electricity storage cell 104 (cell C(n−1)) corresponding to the individual detection circuit Z(n−1) is applied to the output conductive path 4.

If a non-driving signal is provided to the plurality of individual detection circuits 10, and a driving signal is provided only to the low potential-side detection circuit Z1, the FET drive circuit 32 turns on the FET 30 so as to electrically connect the high potential-side electrode (positive electrode) and the output conductive path 4 of the low potential-side cell C1 to each other. At this time, a voltage obtained by subtracting the amount of voltage dropped in the FET 30 from the voltage of the positive electrode of the low potential-side cell C1 is output to the output conductive path 4.

Next, the effects of the present configuration will be illustrated.

In the in-vehicle voltage detection circuit 1 described above, if the control circuit 2 provides a driving signal to any individual detection circuit 10 (drive target circuit), a voltage according to the voltage across both ends of the electricity storage cell 104 corresponding to the drive target circuit is applied to the output conductive path 4, and generation of the output voltage is stopped in the remaining individual detection circuits 10 (non-target circuits) to which a non-driving signal is provided from the control circuit 2. Due to such a configuration, it is possible to detect the cell voltages of the plurality of electricity storage cells 104 by the control circuit 2 switching the driving signal. Moreover, the detection of the cell voltages can be performed via the common output conductive path 4, and it is therefore not necessary to provide the number of outputting signal lines corresponding to the number of cells to be detected.

Furthermore, each of the individual detection circuits 10 can be implemented in a form including the first transistor T21, . . . or Tn1, the second transistor T22, . . . or Tn2, the first resistive portion R21, . . . or Rn1, the second resistive portion R22, . . . or Rn2, and the switch portion S2, . . . or Sn as main elements, and with a configuration that is simpler and can be easily made compact.

Accordingly, this advantage can be utilized for the number of individual detection circuits 10, and hence, the characteristic voltage detection circuit "that detects cell voltages via a common output conductive path 4" can be achieved in a simpler and more compact manner.

The voltage detection circuit 1 includes the third resistive portion R3 having one end electrically connected to the output conductive path 4, and the other end electrically connected to the ground portion. Also, the voltage detection circuit 1 is configured such that, if a driving signal is provided from the control circuit 2 to the drive target circuit, a current according to the current flowing through the second transistor of the drive target circuit flows through the third resistive portion R3, and a voltage according to the voltage across both ends of the third resistive portion R3 is applied to the output conductive path 4. The voltage detection circuit 1 configured in this manner may have, in addition to a configuration in which the detection of the cell voltages can be performed via the common output conductive path 4, a configuration in which a detection value according to each of the cell voltages can be determined from the ratio between the second resistive portion and the third resistive portion R3.

In the voltage detection circuit 1, the resistance value of the first resistive portion is set such that, in each of the individual detection circuits 10, the voltage across the base and the emitter of the first transistor and the voltage across the base and the emitter of the second transistor are identical. With the voltage detection circuit 1 configured in this manner, the potential of one end of the second resistive portion and the potential of the low potential-side electrode of the corresponding electricity storage cell can be identical or approximate to each other in each of the individual detection circuits 10. Accordingly, the voltage across both ends of the second resistive portion more accurately reflects the voltage across both ends of the corresponding electricity storage cell. Therefore, it is possible to achieve a configuration in which a voltage that allows for the cell voltage of each of the electricity storage cells to be determined more accurately can be output to the common output conductive path 4.

Furthermore, in the voltage detection circuit 1, each of the resistance values of the plurality of second resistive portions R22, . . . Rn2 in the plurality of individual detection circuits 10 and the resistance value of the third resistive portion R3 are identical. With the voltage detection circuit 1, in each of the individual detection circuits 10, the voltage across both ends of the second resistive portion and the voltage across both ends of the third resistive portion R3 can be substantially identical or approximate to each other when the individual detection circuit 10 is selected as the drive target circuit, so that a value substantially identical to the cell voltage of the corresponding electricity storage cell, or a value closer to that cell voltage can be output to the common output conductive path 4.

In the in-vehicle electricity storage portion 102, the low potential-side electrode is electrically connected to the ground portion in the low potential-side cell C1 disposed on the lowest potential side among the plurality of electricity storage cells 104. Also, the FET 30 having one end electrically connected to the high potential-side electrode of the low potential-side cell C1, and the other end electrically connected to the output conductive path 4 is provided in the low potential-side detection circuit Z1, and the low potential-side detection circuit Z1 is configured to turn on the FET 30 so as to electrically connect the high potential-side electrode of the low potential-side cell C1 and the output conductive path 4 to each other if a driving signal is provided from the control circuit 2 to the low potential-side detection circuit Z1, and to turn off the FET 30 so as to interrupt electrical connection between the high potential-side electrode of the low potential-side cell C1 and the output conductive path 4 if a non-driving signal is provided. In the voltage detection circuit 1 configured in this manner, if a driving signal is provided from the control circuit 2 to the low potential-side detection circuit Z1, and a non-driving signal is provided to the other individual detection circuits 10, a voltage reflecting the voltage across both ends of the low potential-side cell C1 is output to the common output conductive path 4. In this case, the voltage that is output to the common output conductive path 4 is a voltage according to a value obtained by subtracting the amount of the voltage dropped in the FET 30 from the voltage of the high potential-side electrode of the low potential-side cell C1. However, using the FET 30 along this path can reduce the voltage drop, and therefore a voltage more accurately reflecting the voltage of the high potential-side electrode of the low potential-side cell C1 can be output to the common output conductive path 4.

Other Embodiments

The present disclosure is not limited to the embodiment described by the above statements and drawings, and, for example, the following embodiments also fall within the technical scope of the present disclosure. In addition, the embodiments described above and below may be combined as appropriate as long as there are no mutual inconsistencies.

In the voltage detection circuit 1 shown in FIG. 1, the FET 30 may function as a semiconductor switch element, and each of the resistance values of the plurality of second resistive portions R22 . . . Rn2 in the plurality of individual detection circuits 10 may be larger than the resistance value of the third resistive portion R3. In the voltage detection circuit 1 configured in this manner, if a driving signal is provided from the control circuit 2 to the low potential-side detection circuit Z1, and a non-driving signal is provided to the other individual detection circuits 10, a voltage reflecting the voltage across both ends of the low potential-side cell C1 is output to the common output conductive path 4. In this case, the voltage that is output to the common output conductive path 4 is a voltage according to a value obtained by subtracting the amount of the voltage dropped in the FET 30 (semiconductor switch element) from the voltage of the high potential-side electrode of the low potential-side cell C1. Accordingly, if no measures are taken, there is the possibility that a value lower than the actual cell voltage may be output to the common output conductive path 4 only when the cell voltage of the low potential-side cell C1 is detected, which may make it necessary to use different detection methods for the detection of the cell voltage of the low potential-side cell and the detection of the cell voltages of the other electricity storage cells. However, if each of the resistance values of the second resistive portions R22 . . . Rn2 is set to be larger than the resistance value of the third resistive portion R3 as described above, it is possible to make adjustments such that a value lower than the actual cell voltage is output to the common output conductive path 4 also when the cell voltages of the other electricity storage cells are detected.

Figure 3:
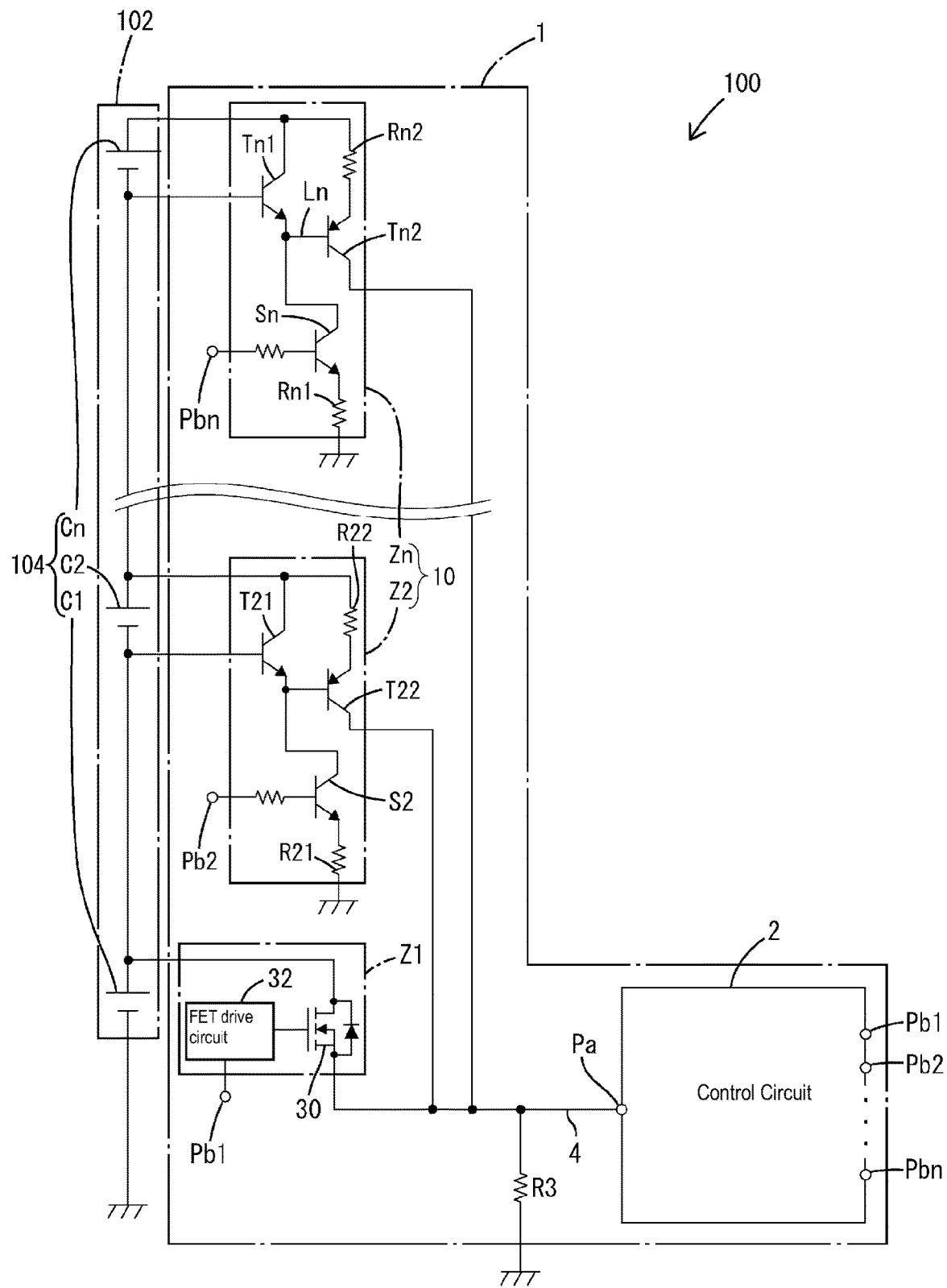
FIG. 3 is a circuit diagram schematically illustrating an in-vehicle power supply system including an in-vehicle voltage detection circuit according to another embodiment.

The circuit of Embodiment 1 shown in FIG. 1 may be modified as shown in FIG. 3. The voltage detection circuit 1 shown in FIG. 3 differs from the configuration of Embodiment 1 shown in FIG. 1 only in that the first resistive portion and the switch portion are interchanged in each of the individual detection circuits 10.

Figure 4:
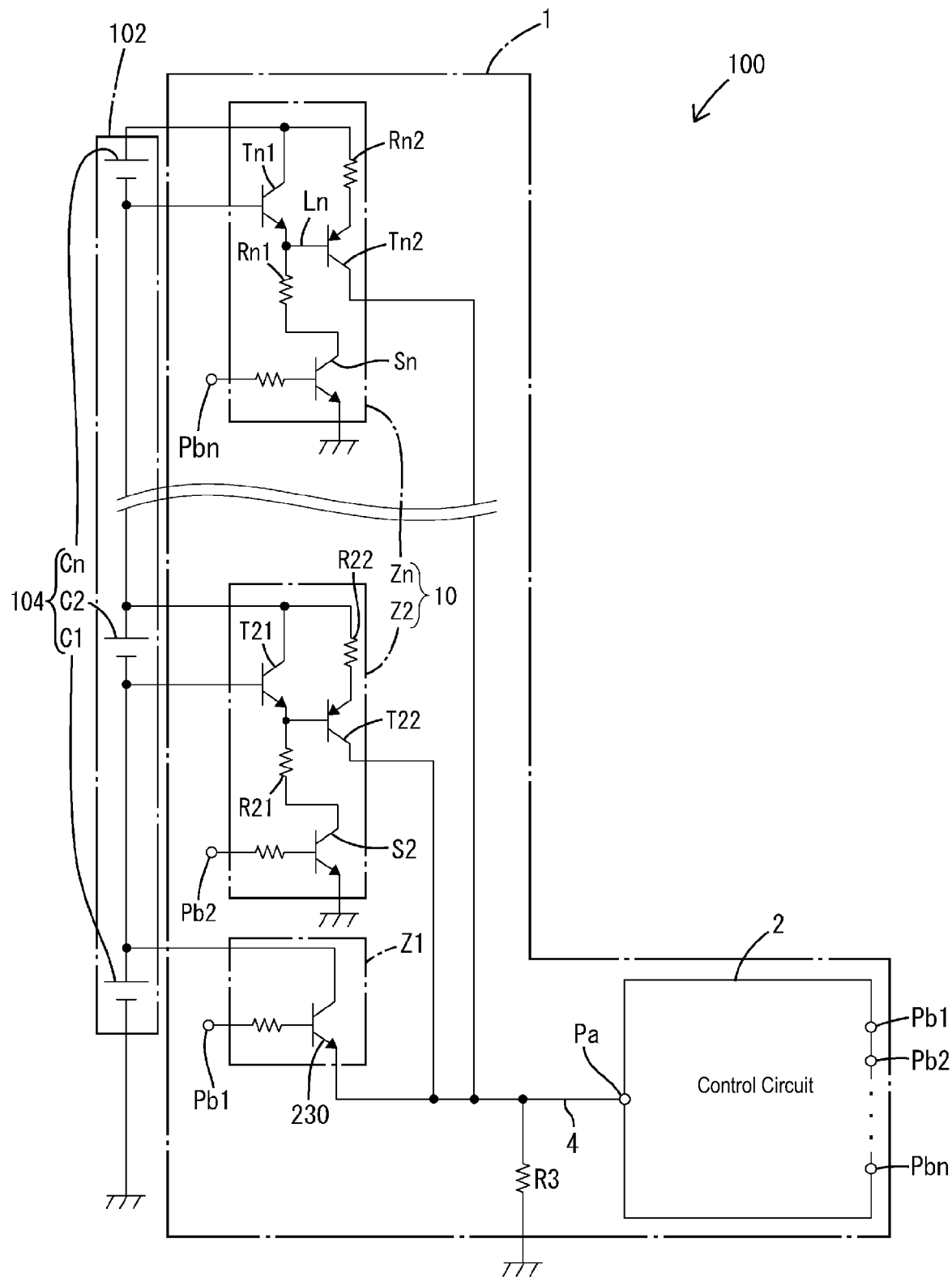
FIG. 4 is a circuit diagram schematically illustrating an in-vehicle power supply system including an in-vehicle voltage detection circuit different from that shown in FIG. 3.

The circuit shown in FIG. 1 relating to Embodiment 1 may be modified as shown in FIG. 4. The voltage detection circuit 1 shown in FIG. 4 uses a low potential-side detection circuit Z1 shown in FIG. 4, in place of the low potential-side detection circuit Z1 of the voltage detection circuit 1 shown in FIG. 1. In the low potential-side detection circuit Z1, a semiconductor switch element 230 is formed by an NPN-type bipolar transistor, and the semiconductor switch element 230 is configured to be turned on if a driving signal is provided to the low potential-side detection circuit Z1 from the control circuit 2, and to be turned off if a non-driving signal is provided.

The invention claimed is:

1. An in-vehicle voltage detection circuit for detecting a voltage of an in-vehicle electricity storage portion including a plurality of electricity storage cells connected in series, the in-vehicle voltage detection circuit comprising:
   a plurality of individual detection circuits that are provided in one-to-one correspondence with at least two or more of the plurality of electricity storage cells, and that are each configured to generate an output voltage according to a voltage across a first end and a second end of the corresponding one of the electricity storage cells if a driving signal is provided, and to stop generation of the output voltage if a non-driving signal is provided;
   a common output conductive path serving as a path to which the output voltage generated in each of the individual detection circuits is applied; and
   a control circuit configured to output the driving signal and the non-driving signal to each of the plurality of individual detection circuits,
   wherein each of the individual detection circuits includes:
   an NPN-type first transistor having a base electrically connected to a low potential-side electrode of the electricity storage cell corresponding to the individual detection circuit, and a collector electrically connected to a high potential-side electrode of the corresponding electricity storage cell;
   a PNP-type second transistor having a base electrically connected to an emitter of the first transistor;
   a first resistive portion disposed between a connection portion connecting the emitter of the first transistor and the base of the second transistor to each other and a ground portion;
   a switch portion that is provided in series with the first resistive portion between the connection portion and the ground portion, and that is configured to be turned on so as to provide a conducting state between the connection portion and the ground portion if the driving signal is provided to the individual detection circuit, and to be turned off so as to provide a non-conducting state between the connection portion and the ground portion if the non-driving signal is provided; and
   a second resistive portion having one end electrically connected to the high potential-side electrode of the electricity storage cell corresponding to the individual detection circuit, and another end electrically connected to an emitter of the second transistor,
   a collector of each of the second transistors in the plurality of individual detection circuits is electrically connected to the output conductive path, and,
   if the driving signal is provided from the control circuit to a drive target circuit that is one of the plurality of individual detection circuits, and the non-driving signal is provided from the control circuit to the non-target circuits, the switch portions of the non-target circuits are configured to be turned off so as to prevent a current from flowing through the first transistors and the second transistors of the non-target circuits, whereby generation of the output voltages in the non-target circuits is stopped, and the switch portion of the drive target circuit is configured to be turned on so as to allow a current to flow through the first transistor and the second transistor of the drive target circuit, whereby a voltage according to a voltage across both ends of the electricity storage cell corresponding to the drive target circuit is applied to the output conductive path.

2. The in-vehicle voltage detection circuit according to claim 1, further comprising:
   a third resistive portion having one end electrically connected to the output conductive path, and another end electrically connected to the ground portion,
   wherein, if the driving signal is provided from the control circuit to the drive target circuit, a current according to a current flowing through the second transistor of the drive target circuit flows through the third resistive portion, and
   a voltage according to a voltage across both ends of the third resistive portion is applied to the output conductive path.

3. The in-vehicle voltage detection circuit according to claim 2, wherein, in each of the individual detection circuits, a resistance value of the first resistive portion is set such that a voltage across the base and the emitter of the first transistor and a voltage across the base and the emitter of the second transistor are identical.

4. The in-vehicle voltage detection circuit according to claim 2, wherein a resistance value of each of the plurality of the second resistive portions in the plurality of individual detection circuits and a resistance value of the third resistive portion are identical.

5. The in-vehicle voltage detection circuit according to claim 2, wherein a low potential-side cell disposed on a lowest potential side among the plurality of electricity storage cells constituting the in-vehicle electricity storage portion has a low potential-side electrode electrically connected to the ground portion, and
   the in-vehicle voltage detection circuit comprises a low potential-side detection circuit including a semiconductor switch element having one end electrically connected to a high potential-side electrode of the low potential-side cell, and another end electrically connected to the output conductive path, the low potential-side detection circuit is configured to turn on the semiconductor switch element so as to electrically connect the high potential-side electrode of the low potential-side cell and the output conductive path to each other if the driving signal is provided from the control circuit to the low potential-side detection circuit, and to turn off the semiconductor switch element so as to interrupt electrical connection between the high potential-side electrode of the low potential-side cell and the output conductive path if the non-driving signal is provided, and a resistance value of each of the plurality of second resistive portions in the plurality of individual detection circuits is larger than a resistance value of the third resistive portion.

6. The in-vehicle voltage detection circuit according to claim 1, wherein a low potential-side cell disposed on a lowest potential side among the plurality of electricity storage cells constituting the in-vehicle electricity storage portion has a low potential-side electrode electrically connected to the ground portion, the in-vehicle voltage detection circuit comprises a low potential-side detection circuit including a field effect transistor (FET) having one end electrically connected to a high potential-side electrode of the low potential-side cell, and another end electrically connected to the output conductive path, and the low potential-side detection circuit is configured to turn on the FET so as to electrically connect the high potential-side electrode of the low potential-side cell and the output conductive path to each other if the driving signal is provided from the control circuit to the low potential-side detection circuit, and to turn off the FET so as to interrupt electrical connection between the high potential-side electrode of the low potential-side cell and the output conductive path if the non-driving signal is provided.

7. The in-vehicle voltage detection circuit according to claim 3, wherein a resistance value of each of the plurality of the second resistive portions in the plurality of individual detection circuits and a resistance value of the third resistive portion are identical.

8. The in-vehicle voltage detection circuit according to claim 3, wherein a low potential-side cell disposed on a lowest potential side among the plurality of electricity storage cells constituting the in-vehicle electricity storage portion has a low potential-side electrode electrically connected to the ground portion, and the in-vehicle voltage detection circuit comprises a low potential-side detection circuit including a semiconductor switch element having one end electrically connected to a high potential-side electrode of the low potential-side cell, and another end electrically connected to the output conductive path, the low potential-side detection circuit is configured to turn on the semiconductor switch element so as to electrically connect the high potential-side electrode of the low potential-side cell and the output conductive path to each other if the driving signal is provided from the control circuit to the low potential-side detection circuit, and to turn off the semiconductor switch element so as to interrupt electrical connection between the high potential-side electrode of the low potential-side cell and the output conductive path if the non-driving signal is provided, and a resistance value of each of the plurality of second resistive portions in the plurality of individual detection circuits is larger than a resistance value of the third resistive portion.

9. The in-vehicle voltage detection circuit according to claim 2, wherein a low potential-side cell disposed on a lowest potential side among the plurality of electricity storage cells constituting the in-vehicle electricity storage portion has a low potential-side electrode electrically connected to the ground portion, the in-vehicle voltage detection circuit comprises a low potential-side detection circuit including a field effect transistor (FET) having one end electrically connected to a high potential-side electrode of the low potential-side cell, and another end electrically connected to the output conductive path, and the low potential-side detection circuit is configured to turn on the FET so as to electrically connect the high potential-side electrode of the low potential-side cell and the output conductive path to each other if the driving signal is provided from the control circuit to the low potential-side detection circuit, and to turn off the FET so as to interrupt electrical connection between the high potential-side electrode of the low potential-side cell and the output conductive path if the non-driving signal is provided.

10. The in-vehicle voltage detection circuit according to claim 3, wherein a low potential-side cell disposed on a lowest potential side among the plurality of electricity storage cells constituting the in-vehicle electricity storage portion has a low potential-side electrode electrically connected to the ground portion, the in-vehicle voltage detection circuit comprises a low potential-side detection circuit including a field effect transistor (FET) having one end electrically connected to a high potential-side electrode of the low potential-side cell, and another end electrically connected to the output conductive path, and the low potential-side detection circuit is configured to turn on the FET so as to electrically connect the high potential-side electrode of the low potential-side cell and the output conductive path to each other if the driving signal is provided from the control circuit to the low potential-side detection circuit, and to turn off the FET so as to interrupt electrical connection between the high potential-side electrode of the low potential-side cell and the output conductive path if the non-driving signal is provided.

11. The in-vehicle voltage detection circuit according to claim 4, wherein a low potential-side cell disposed on a lowest potential side among the plurality of electricity storage cells constituting the in-vehicle electricity storage portion has a low potential-side electrode electrically connected to the ground portion, the in-vehicle voltage detection circuit comprises a low potential-side detection circuit including a field effect transistor (FET) having one end electrically connected to a high potential-side electrode of the low potential-side cell, and another end electrically connected to the output conductive path, and the low potential-side detection circuit is configured to turn on the FET so as to electrically connect the high potential-side electrode of the low potential-side cell and the output conductive path to each other if the driving signal is provided from the control circuit to the low potential-side detection circuit, and to turn off the FET so as to interrupt electrical connection between the high potential-side electrode of the low potential-side cell and the output conductive path if the non-driving signal is provided.

12. The in-vehicle voltage detection circuit according to claim 5, wherein the semiconductor switch is a field effect transistor (FET) having one end electrically connected to the high potential-side electrode of the low potential-side cell, and another end electrically connected to the output conductive path, and the low potential-side detection circuit is configured to turn on the FET so as to electrically connect the high potential-side electrode of the low potential-side cell and the output conductive path to each other if the driving signal is provided from the control circuit to the low potential-side detection circuit, and to turn off the FET so as to interrupt electrical connection between the high potential-side electrode of the low potential-side cell and the output conductive path if the non-driving signal is provided.

\* \* \* \* \*